United States Patent [19]
Chen

[11] Patent Number: 5,942,343
[45] Date of Patent: Aug. 24, 1999

[54] BONDED SAPPHIRE, AND METHOD OF MAKING SAME

[75] Inventor: William W. Chen, Los Angeles, Calif.

[73] Assignee: Raytheon Company, Lexington, Mass.

[21] Appl. No.: 08/951,999

[22] Filed: Oct. 16, 1997

[51] Int. Cl.[6] .................................................. B32B 17/00
[52] U.S. Cl. ...................... 428/700; 428/701; 428/702; 264/1.21; 264/1.7; 264/235; 264/345
[58] Field of Search ................................. 264/1.21, 1.7, 264/82, 235, 345; 428/700, 701, 702

[56] References Cited

U.S. PATENT DOCUMENTS 5,201,977   4/1993   Aoshima ............................... 156/153
5,702,654  12/1997   Chen ...................................... 264/82

*Primary Examiner*—Timothy M. Speer
*Attorney, Agent, or Firm*—Colin M. Raufer; Leonard A. Alkov; Glenn H. Lenzen, Jr.

[57] ABSTRACT

A large, monolithic sapphire structure for use in mid-IR military applications, such as, for example, a window or screen for radar detection equipment. The structure is made by bonding together two or more smaller sapphire panes by a method including the steps of coating a surface of each of the panes with a magnesia vapor and contacting the magnesia-coated surfaces with each other in the presence of a hydrogen-containing gas at a temperature (e.g., about 1500° C. and 2000° C.) and for a time period (e.g., about 45 minutes to about ten hours) sufficient to form a continuous magnesia-alumina spinel interlayer bond between the panes.

25 Claims, 1 Drawing Sheet

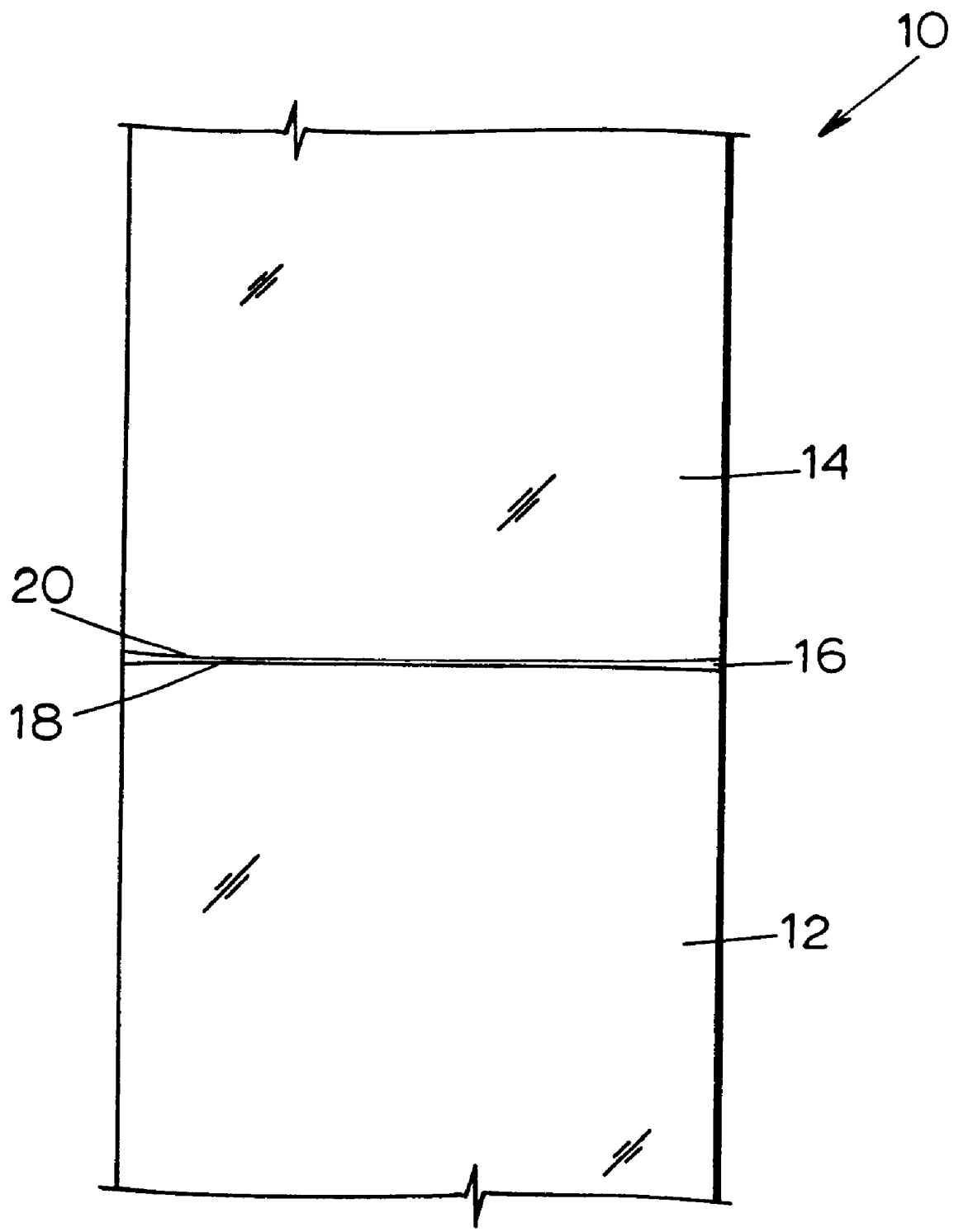

BONDED SAPPHIRE, AND METHOD OF MAKING SAME

BACKGROUND OF THE INVENTION

1. Field of the Invention

This invention relates to mid-IR applications. More specifically, this invention relates to sapphire panes and a method of bonding sapphire panes together in order to make a larger, monolithic sapphire structure which can be used in mid-IR applications.

2. Brief Description of the Related Art

Sapphire, a single crystal form of aluminum oxide ($Al_2O_3$), is commonly used in electron tubes, microwave tubes, and aluminum composites. Sapphire is also used as optical elements in radiation detectors, as substrates for thin-film components in integrated circuits, and in other precision instruments.

Sapphire has a structural integrity and temperature stability suitable for many military applications and is able to transmit light in the visible, infra-red (IR), and ultra-violet (UV) spectra. Sapphire is typically found in the form of a rod, a whisker, a single crystal, a sphere, or a small disc. Because of its structural integrity, temperature stability, and excellent light transmission capabilities, sapphire would be ideal for use as an optical element in military optical sensor equipment. Its use, however, is limited due to the availability of large size parts.

Heretofore, it has not been possible to manufacture a larger, monolithic sapphire structure by bonding together smaller sapphire elements (or panes) without compromising the superior light transmission properties of the individual sapphire panes. Bonding technology known in the art (e.g., mechanical attachment, adhesive bonding, glazing, brazing, diffusion bonding, and/or fusion welding) generally has not proven to be suitable for joining individual sapphire panes together.

For example, diffusion-bonding (or fusion-welding) of two substrates to each other typically is accomplished by a solid-state reaction using high pressures and temperatures. While diffusion bonding similar substrates together usually produces a contact between the substrates, the bond may be of a low structural integrity. In order to overcome the possible structural shortcoming, an interlayer bonding material diffused between the substrates at the bond interface is often used to form a stronger bond. Since sapphire is a single crystal material, the interlayer bonding material must maintain epitaxy between the joined sapphire pieces. Any thermal expansion mismatch between the substrate and the interlayer bonding material must be minimized to avoid the formation of expansion stress cracks. Alternatively, the conditions for joining must be selected to provide a thin bond line that will not crack in response to a thermal expansion mismatch.

While use of the interlayer bonding material may satisfy the structural integrity requirement demanded of sapphire in military environments, the interlayer bonding material must also satisfy the optical requirements demanded in mid-IR applications. The interlayer bonding material and area of bonding at the interface of the individual sapphire panes must be able to transmit light in the visible and mid-IR spectra. This requirement for a mid-IR material sharply reduces the number of materials available for diffusion bonding sapphire panes.

Other methods for bonding together various ceramic materials include bonding at low temperature with cementitous materials or bonding at elevated temperatures with the use of metalizers. Still another method uses a eutectic mixture of aluminum oxide and zirconium oxide to form a eutectic bond between the sapphire elements. However, these methods use bonding materials (e.g., metal, silicon oxide, and/or zirconium oxide) whose crystallography and optical properties do not provide a satisfactory epitaxy or mid-IR light transmission at the bond interface.

It would be desirable to provide a method of making a large, monolithic sapphire structure from individual sapphire panes, wherein the structure has approximately the same mechanical, optical, and crystallographic properties of the individual panes. Furthermore, it would be desirable to provide a method of making a large, monolithic sapphire structure having a structural integrity and optical characteristics suitable for use in mid-IR applications.

SUMMARY OF THE INVENTION

It is an object of the invention to overcome one or more of the problems described above.

In brief, the invention is directed to a method of bonding small, individual sapphire panes together to form a larger, monolithic sapphire structure having mechanical, optical, and crystallographic characteristics similar to those of the individual sapphire panes.

In one aspect, the invention provides a large, monolithic sapphire structure and a bonding method for making the same from two or more sapphire panes. The method includes the steps of coating a surface of each of the panes with a layer of magnesia, and contacting the magnesia-coated surfaces with each other in the presence of a hydrogen containing gas at a temperature and time sufficient to form a bond between the panes.

In another aspect, the invention is a method of bonding sapphire panes together. The method includes placing a heated surface of each of the panes into contact with one another to form a bond interface between the surfaces, wherein the interface has microscopic pathways due to surface roughness filled with a hydrogen-containing gas. The method also includes diffusing heated magnesia vapor through the microscopic pathways. Furthermore, the method includes reacting the heated magnesia vapor with the sapphire in the presence of the hydrogen-containing gas to form a continuous magnesia-alumina spinel interlayer between the surfaces such that the interlayer forms a continuous epitaxy between the panes.

The invention reduces the difficulties and disadvantages of the prior art by providing a relatively simple method for forming large, monolithic sapphire structures that can be used in mid-IR (e.g., light having a wavelength of about two microns to about five microns) military applications, such as windows for radar equipment. Furthermore, the invention provides for a method of bonding sapphire structures with a bond interlayer material having a suitable IR transmission capability, a suitable crystalline epitaxy with the sapphire, and a suitable temperature stability for use in mid-IR military applications.

Other aspects and advantages of the invention will become apparent to those skilled in the art from a review of the following detailed description, taken in conjunction with the drawing and the appended claims.

BRIEF DESCRIPTION OF THE DRAWING

The sole FIGURE is a partial schematic view of a bonded sapphire structure made according to the invention.

DETAILED DESCRIPTION OF THE INVENTION

The invention is directed to a monolithic sapphire structure and a method for making such a structure from smaller, individual sapphire panes. The method includes the steps of coating a surface of each of the sapphire panes with a layer of magnesium oxide, MgO (hereafter "magnesia"), and contacting the magnesia-coated surfaces with each other in the presence of a hydrogen containing gas at a temperature and time sufficient to form a bond between the panes. The formed bond and monolithic structure exhibit mechanical, optical, and crystallographic characteristics similar, if not identical, to those of the individual sapphire panes.

Alternatively, the invention is directed to a method of bonding sapphire panes together which includes placing a heated surface of each of the panes into contact with one another to form a bond interface between the surfaces, wherein the interface has microscopic pathways filled with a hydrogen-containing gas. The method also includes diffusing heated magnesia vapor through the microscopic pathways, and reacting the heated magnesia vapor with the sapphire in the presence of the hydrogen-containing gas to form a continuous magnesia-alumina spinel interlayer between the surfaces such that the interlayer is epitaxial between the panes.

The formed sapphire structure is capable of transmitting light having a wavelength of about two microns to about five microns. Furthermore, the formed structure has a suitable temperature stability and structural integrity for use in mid-IR military applications.

Individual sapphire panes are bonded to each other using magnesia. When heated in the presence of a hydrogen-containing gas, magnesia vapor reacts with aluminum oxide at the sapphire-to-sapphire bonding interface to form a magnesia-alumina spinel ($MgAl_2O_4$) glaze over the reacted sapphire surfaces. Concurrently with the formation and growth of the magnesia-alumina spinel, the magnesia-alumina spinel also acts to bond the sapphire panes together by inter-diffusion of the spinel into each sapphire pane. The hydrogen-containing gas contains about five volume percent to about 100 volume percent hydrogen and about zero volume percent to about 95 volume percent of one or more inert gases (e.g., nitrogen or argon).

Magnesia-alumina spinel has a crystallographic structure similar to ferrites, such as ferric oxide ($Fe_2O_3$).

Furthermore, the crystallographic orientation between the isomorphic crystal hematite $Fe_2O_3$ and the magnetite ($FeO \cdot Fe_2O_3$) is the same as the crystallographic orientation between the sapphire ($Al_2O_3$) and the spinel ($MgO \cdot Al_2O_3$). See Table I below.

TABLE I

|  | $Al_2O_3$ | $MgO.Al_2O_3$ | $Fe_2O_3$ | $FeO.Fe_2O_3$ |
|---|---|---|---|---|
| Plane | (0001) | (111) | (0001) | (111) |
| Direction | [1010] | [110] | [1010] | [110] |

This crystallographic orientation corresponds to the matching of closely-packed oxygen planes and the direction of close packing within each plane for each structure. The orientation is described more fully in R. E. Carter et al., Orientation Relation Between a Hematite Precipitate and Its Ferrite Host, 42 J. OF AM. CERAMIC SOC. 533, 533–536 (November 1959). Aluminum-rich spinel forms epitaxially with sapphire since the oxygen layers for the spinel and sapphire are psuedohexagonally closely packed. Therefore, the spinel interlayer should form an oriented crystalline bond ("epitaxy") between the two sapphire surfaces. The magnesia to sapphire molar ratio in the spinel composition may range from about 1:1 to about 1:3.5.

It is not desirable to try to bond flat surfaces together because of the possibility that a bond will form near the edges of the bond interface before a sufficient amount of the magnesia vapor is able to diffuse into the central regions of the bond interface. This would result in a bond interface having no spinel at the central regions and, therefore, would result in a weak structure unsuitable for military applications. Accordingly, it is desirable to bond slightly curved surfaces so that central regions of the bond interface will react with the magnesia to form a spinel first. As the bond forms near the central regions, the magnesia will continue to react near edge areas of the bond interface.

Additionally, it is believed that a slightly curved surface of the sapphire panes at the bond interface enhances the vapor transport diffusion mechanism. This is desirable since better vapor transport diffusion promotes a better structural joint while maintaining epitaxy between the sapphire pieces. See, W. D. Kingery et al., INTRODUCTION TO CERAMICS, John Wiley & Sons, New York, pgs. 470–475 (1976). Thus, a sapphire structure having desirable structural integrity is ensured as all portions of the bond interface will contain a continuous interlayer of the spinel. The thickness of the magnesia-alumina spinel interlayer is less than twenty mils (0.051 centimeters), preferably less than about five mils (0.013 centimeters), more preferably less than about one mil (0.0025 centimeters).

Physical vapor deposition ("PVD") means may be used to coat surfaces of the sapphire structure with the heated magnesia vapor. Furthermore, PVD means may be used to diffuse magnesia vapor through microscopic pathways inherent in the bond interface between sapphire panes. Generally, when employing PVD means according to the inventive method, the sapphire panes and magnesia vapor should be heated to a reaction temperature and for a period of time suitable to result in a bond between the sapphire panes. A suitable reaction temperature for the PVD means is about 1500° C. to about 2000° C., preferably about 1600° C. to about 1750° C. The reaction temperature should be maintained for a time period of about 45 minutes to about ten hours, preferably about one hour to about eight hours, and more preferably about one hour to about four hours.

Magnesia-alumina spinel satisfies many of the requirements as a diffusion bond material for use in mid-IR applications. The spinel has been used to form a polycrystalline, fully dense, transparent dome for missile nose cones. Thus, the thermal and mechanical properties of the spinel have been established in military applications.

The invention provides for a method of bonding sapphire structures with a bond interlayer material having a suitable IR transmission capability, a suitable crystalline epitaxy with the sapphire, and a suitable temperature stability for use in mid-IR military applications. Furthermore, the sapphire structure formed by the inventive method has approximately the same mechanical, optical, and crystallographic properties of the individual sapphire panes.

Referring now to the sole drawing FIGURE, a bonded sapphire structure 10 made by the inventive method is shown. The structure includes a first sapphire pane 12 bonded to a second sapphire pane 14 with a magnesia-alumina spinel interlayer 16. Each of the sapphire panes 12, 14 are shown having a curved edge 18, 20, respectively, for the purpose of easily forming the continuous magnesia-alumina spinel interlayer 16.

EXAMPLE

The presence of a magnesia-alumina spinel between bonded sapphire panes was verified by examining the bond formed at the interface between two sapphire panes. Two sapphire panes were placed in a gas-tight magnesia fixture containing a hydrogen-rich atmosphere, the fixture comprising a magnesia crucible and a magnesia lid. The sapphire panes, each of which had an edge, were positioned within the fixture such that the edges were in contact with each other, and the panes were arranged atop one another to use gravitational forces to maintain a slight pressure at the eventual bond interface. Molybdenum masking sheets were used to cover those portions of the sapphire panes not intended to be exposed to heated magnesia vapor.

The magnesia fixture and the sapphire panes therein were heated for a heating period of about eight hours at a reaction temperature of about 1900° C. in the hydrogen-rich atmosphere. During this heating period, a portion of the magnesia making up the magnesia fixture vaporized and reacted with the alumina (sapphire panes) to form a magnesia-alumina spinel glaze over the un-masked area of the pane. Although the panes were in contact with each other, magnesia vapor was able to diffuse through microscopic pathways that are inherently present at the surface-to-surface bond interface.

Upon completion of heating and subsequent cooling, visual inspection of the panes and the bond interface revealed a clear bond line having a visual appearance identical to the sapphire panes adjacent the bond line. Energy dispersive analysis of the bond material confirmed the presence of magnesium and aluminum atoms and also confirmed that the interlayer bond material was magnesia-alumina spinel.

It was determined that the thickness of the formed spinel was dependent upon a variety of processing conditions, such as, for example, temperature, heating period, and hydrogen concentration in the atmosphere surrounding the bond interface. For example, the thickness of the bond interlayer was determined by scanning electro micrograph to be about 0.0015 inches (0.0038 centimeters) thick when two sapphire elements were heated in a hydrogen atmosphere at 1600° C. for one hour. Table II, below, shows a relationship between the temperature and the thickness of a formed spinel at a constant hydrogen atmosphere and a heating period of one hour.

TABLE II

| Thickness (inches) | Temp (°C.) | Heating Period (hours) | $H_2$ Conc. (Vol. %) |
|---|---|---|---|
| 0.0015 | 1600 | 1.0 | 100 |
| 0.004–0.005 | 1700 | 1.0 | 100 |
| 0.013 | 1800 | 1.0 | 100 |
| 0.020 | 1900 | 1.0 | 100 |

The foregoing description is given for clearness of understanding only, and no unnecessary limitations should be understood therefrom, as modifications within the scope of the invention will be apparent to those skilled in the art.

What is claimed is:

1. A method of bonding at least two sapphire panes together, said method comprising the steps of:
   (a) coating a surface of each of said panes with a layer of magnesia; and
   (b) contacting said magnesia-coated surfaces with each other in the presence of a hydrogen-containing gas at a temperature and time sufficient to form a continuous bond between said panes.

2. The method of claim 1, wherein said bond is a magnesia-alumina spinel.

3. The method of claim 2, wherein said hydrogen-containing gas comprises about five volume percent to about 100 volume percent hydrogen and about zero volume percent to about 95 volume percent of one or more inert gases.

4. The method of claim 3, wherein said surfaces of said panes are coated with said layer of magnesia by physical vapor deposition.

5. The method of claim 4, comprising the step of heating magnesia and said surfaces of said panes to a temperature of about 1500° C. to about 2000° C. for a time period of about 45 minutes to about ten hours.

6. The method of claim 5, comprising heating said magnesia and said surfaces of said panes to a temperature of about 1600° C. to about 1750° C. for a time period of about one hour to about four hours.

7. The method of claim 2, wherein said magnesia-alumina spinel bond has a thickness of less than about twenty mils.

8. The method of claim 7, wherein said magnesia-alumina spinel bond has a thickness of less than about five mils.

9. The method of claim 8, wherein said magnesia-alumina spinel bond has a thickness of less than about one mil.

10. A method of bonding at least two sapphire panes together, said method comprising the steps of: (a) heating a surface of each of said panes; (b) placing the heated surfaces of each of said panes into contact with one another in the presence of a hydrogen-containing gas said surfaces having microscopic pathways filled with said hydrogen-containing gas;
   (c) diffusing heated magnesia vapor through said microscopic pathways; and
   (d) reacting said heated magnesia vapor with said sapphire in the presence of said hydrogen-containing gas to form a continuous magnesia-alumina spinel interlayer between said surfaces, said interlayer forming a continuous epitaxy between said panes.

11. The method of claim 10, comprising the step of heating said magnesia and said surfaces of said panes to a temperature of about 1500° C. to about 2000° C. for a time period of about 45 minutes to about ten hours.

12. The method of claim 11, comprising the step of heating said magnesia and said surfaces of said panes to a temperature of about 1600° C. to about 1750° C. for a time period of about one hour to about four hours.

13. The method of claim 10, wherein said magnesia-alumina spinel interlayer has a thickness of less than about twenty mils.

14. The method of claim 13, wherein said magnesia-alumina spinel interlayer has a thickness of less than about five mils.

15. The method of claim 14, wherein said magnesia-alumina spinel interlayer has a thickness of less than about one mil.

16. The method of claim 10, wherein said hydrogen-containing gas comprises about five volume percent to about 100 volume percent hydrogen and about zero volume percent to about 95 volume percent of one or more inert gases.

17. A sapphire structure made from two or more sapphire panes by a method comprising the steps of:
   (a) coating a surface of each of said panes with a layer of magnesia; and
   (b) contacting said magnesia-coated surfaces with each other in the presence of a hydrogen-containing gas at a temperature and for a time sufficient to form a bond between said panes.

18. The sapphire structure of claim 17, wherein said bond is a magnesia-alumina spinel.

19. The sapphire structure of claim 18, wherein said hydrogen-containing gas comprises about five volume percent to about 100 volume percent hydrogen and about zero volume percent to about 95 volume percent of one or more inert gases.

20. The sapphire structure of claim 19, wherein said surfaces of said panes are coated with said layer of magnesia by physical vapor deposition.

21. The sapphire structure of claim 20, comprising the step of heating said magnesia and said surfaces of said panes to a temperature of about 1500° C. to about 2000° C. for a time period of about 45 minutes to about ten hours.

22. The sapphire structure of claim 21, comprising heating said magnesia and said surfaces of said panes to a temperature of about 1600° C. to about 1750° C. for a time period of about one hour to about four hours.

23. The sapphire structure of claim 18, wherein said magnesia-alumina spinel bond has a thickness of less than about twenty mils.

24. The sapphire structure of claim 23, wherein said magnesia-alumina spinel bond has a thickness of less than about five mils.

25. The sapphire structure of claim 24, wherein said magnesia-alumina spinel bond has a thickness of less than about one mil.

* * * * *